(12) United States Patent  (10) Patent No.: US 9,153,473 B2
Li et al.  (45) Date of Patent: Oct. 6, 2015

(54) WAFER PROCESSING

(71) Applicant: GLOBALFOUNDRIES Singapore Pte. Ltd., Singapore (SG)

(72) Inventors: Liang Li, Singapore (SG); Wei Lu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/032,206

(22) Filed: Sep. 20, 2013

(65) Prior Publication Data

US 2015/0087133 A1  Mar. 26, 2015

(51) Int. Cl.
*H01L 21/311* (2006.01)
*H01L 21/336* (2006.01)
*H01L 21/461* (2006.01)
*H01L 21/76* (2006.01)
*H01L 23/58* (2006.01)
*H01L 21/762* (2006.01)
*H01L 21/3213* (2006.01)

(52) U.S. Cl.
CPC .... *H01L 21/76224* (2013.01); *H01L 21/32134* (2013.01)

(58) Field of Classification Search
CPC . H01L 21/324; H01L 21/76224; H01L 21/02; H01L 21/02109; H01L 21/311; H01L 21/762
USPC ............ 438/424, 14, 386, 612; 257/347, 432, 257/E21.214, E21.409
See application file for complete search history.

(56) References Cited

U.S. PATENT DOCUMENTS

| | | | |
|---|---|---|---|
| 4,925,809 A * | 5/1990 | Yoshiharu et al. ............ | 117/106 |
| 5,296,385 A * | 3/1994 | Moslehi et al. ............... | 438/514 |
| 5,607,543 A | 3/1997 | Eisenberg et al. | |
| 5,837,378 A * | 11/1998 | Mathews et al. .............. | 438/439 |
| 5,981,353 A * | 11/1999 | Tsai .............................. | 438/424 |
| 6,025,250 A * | 2/2000 | Ha et al. ........................ | 438/459 |
| 7,064,072 B1 | 6/2006 | Ting et al. | |
| 2008/0108223 A1 | 5/2008 | Wang et al. | |
| 2008/0173977 A1* | 7/2008 | Chinthakindi et al. ....... | 257/532 |
| 2009/0032935 A1* | 2/2009 | Bhowmik et al. ............ | 257/701 |
| 2009/0191688 A1* | 7/2009 | Hu et al. ........................ | 438/424 |
| 2009/0197355 A1* | 8/2009 | Terahara ......................... | 438/14 |
| 2009/0294807 A1* | 12/2009 | Yan et al. ....................... | 257/288 |
| 2011/0201172 A1 | 8/2011 | Chew et al. | |
| 2012/0007199 A1 | 1/2012 | Li et al. | |
| 2012/0313170 A1 | 12/2012 | Chang et al. | |
| 2014/0103429 A1* | 4/2014 | Chuang et al. ................ | 257/335 |

* cited by examiner

*Primary Examiner* — Kimberly Rizkallah
*Assistant Examiner* — Brian Turner
(74) *Attorney, Agent, or Firm* — Horizon IP Pte. Ltd.

(57) ABSTRACT

Methods for forming a device are presented. A substrate having top and bottom pad stacks is provided. Each pad stack includes at least first and second pad layers. The second pad layers of the top and bottom pad stacks include an initial thickness $T_{T1}$ and $T_{B1}$ respectively. Trench isolation regions are formed in the substrate. The second pad layer of the top and bottom pad stacks are removed after forming the trench isolation regions by a batch wet etch process.

20 Claims, 13 Drawing Sheets

WAFER PROCESSING

CROSS-REFERENCE

This application is concurrently filed with application Ser. No. 14/032,203 entitled "Wafer Processing", which is herein incorporated by reference for all purposes.

BACKGROUND

Wafer warpage is a common problem in wafer processing. The non-balance between the stress level of the frontside and backside of the wafer during mechanical processing of the wafer surface and thermal processes used in wafer processing often lead to wafer warpage. Warped wafers can cause reliability issues and therefore affecting the device performance.

Hence, it is desirable to provide efficient and simplified methods for wafer processing which minimizes or prevents wafer warpage.

SUMMARY

Embodiments generally relate to semiconductor device and methods for forming a semiconductor device. In one embodiment, a method of forming a device is disclosed. A substrate having top and bottom pad stacks is provided. Each pad stack includes at least first and second pad layers. The second pad layers of the top and bottom pad stacks include an initial thickness $T_{T1}$ and $T_{B1}$ respectively. Trench isolation regions are formed in the substrate. The second pad layer of the top and bottom pad stacks are removed after forming the trench isolation regions by a batch wet etch process.

In another embodiment, a method of forming a device is presented. A substrate having top and bottom pad stacks is provided. Each pad stack includes at least first and second pad layers. The second pad layers of the top and bottom pad stacks include an initial thickness $T_{T1}$ and $T_{B1}$ respectively. Trench isolation regions are formed in the substrate. The second pad layer of the top and bottom pad stacks are removed after forming the trench isolation regions. A gate dielectric layer surrounding top, bottom and side surfaces of the substrate is formed. A protective layer is formed over a top surface of the gate dielectric layer. Exposed portions of the gate dielectric layer not covered by the protective layer are removed.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-1m show an embodiment of a process for forming a device.

DETAILED DESCRIPTION

Embodiments generally relate to semiconductor devices or integrated circuits (ICs). More particularly, some embodiments relate to wafer processing in forming devices. For example, the devices may be any type of devices. The devices or ICs can be incorporated into or used with, for example, consumer electronic products, such as cell phones, laptop computers and personal digital assistants (PDAs).

Figure 1A:
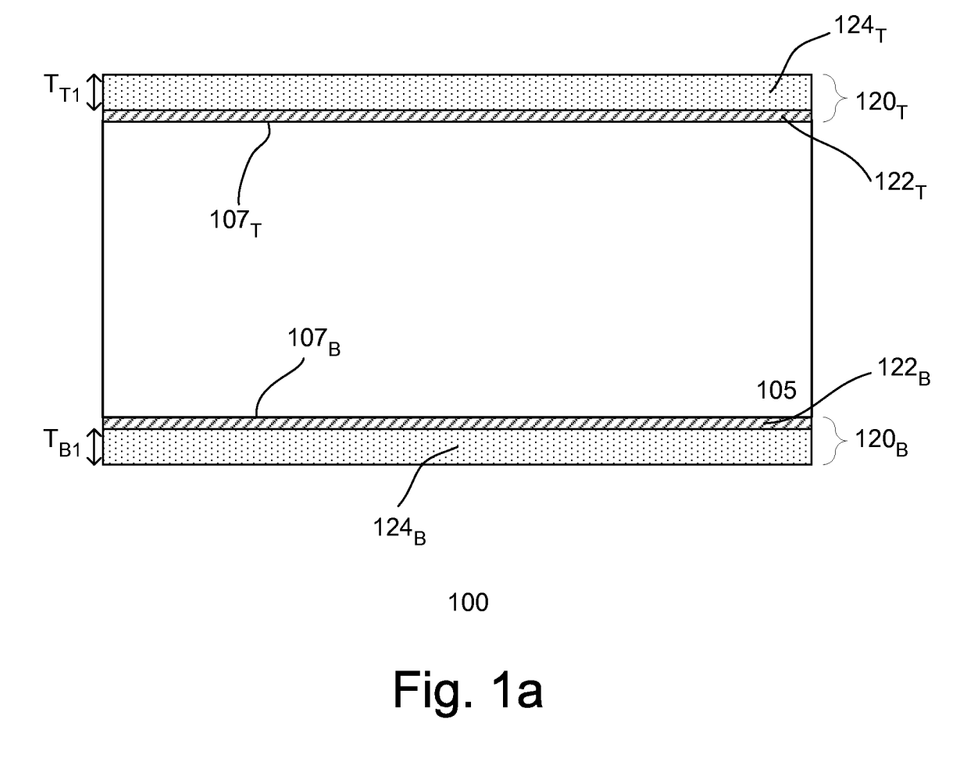

FIGS. 1a-1m show cross-sectional views of an embodiment of a process for forming a device 100. Referring to FIG. 1a, a substrate 105 is provided. The substrate, in one embodiment, is a semiconductor wafer, such as a silicon wafer. The wafer may be a doped wafer, such as a p⁻ substrate. Other types of substrates, such as a germanium-based, gallium arsenide, sapphire, or COI such as SOI, may also be useful. The wafer may be doped with other types of dopants or dopant concentrations, including undoped wafers. The wafer, for example, is processed to form a plurality of dies or chips in parallel. The wafer is then diced to singulate the dies.

The substrate includes a plurality of device regions. In one embodiment, the device regions include high voltage (HV) device regions for HV transistors. Providing other types of transistors or devices may also be useful. For illustration purpose, HV device regions are shown. It is understood that the substrate may also include regions for other types of circuitry, depending on the type of device or IC.

As shown in FIG. 1a, the wafer substrate is at the initial stage of processing. In one embodiment, the substrate is provided with top and bottom pad stacks $120_T$ and $120_B$ on top and bottom surfaces of the wafer. The top surface $107_T$ may be referred to as the frontside and the bottom surface $107_B$ may be referred to as the backside. A pad stack includes first and second pad layers 122 and 124. The first pad layer is disposed on the substrate while the second pad layer is disposed on the first pad layer. Providing a pad stack with more than two layers may also be useful. In one embodiment, the first pad layer is a pad silicon oxide layer and the second pad layer is a pad silicon nitride layer. The pad oxide layer serves to provide adhesion and relieve mechanical stress caused by mismatches between coefficients of thermal expansion of the substrate and overlying layers. In one embodiment, the pad layers are formed by thermal processes, such as batch furnace processes. Forming the pad layer using other suitable techniques may also be useful.

The pad oxide layer of the frontside and backside pad stacks, for example, includes the same initial thickness. The initial thickness of the pad oxide layer of both pad stacks may be, for example, about 50 Å thick. The pad nitride layer of the frontside and backside pad stacks, in one embodiment, also includes the same initial thickness. For example, the initial thickness $T_{T1}$ of the frontside pad nitride layer $124_T$ is the same as the initial thickness $T_{B1}$ of the backside pad nitride layer $124_B$ as shown in FIG. 1a. The thickness $T_{T1}$ and $T_{B1}$, for example, may be about 1300 Å. Other suitable initial thickness dimensions for the first and second pad layers may also be useful.

Figure 1B:
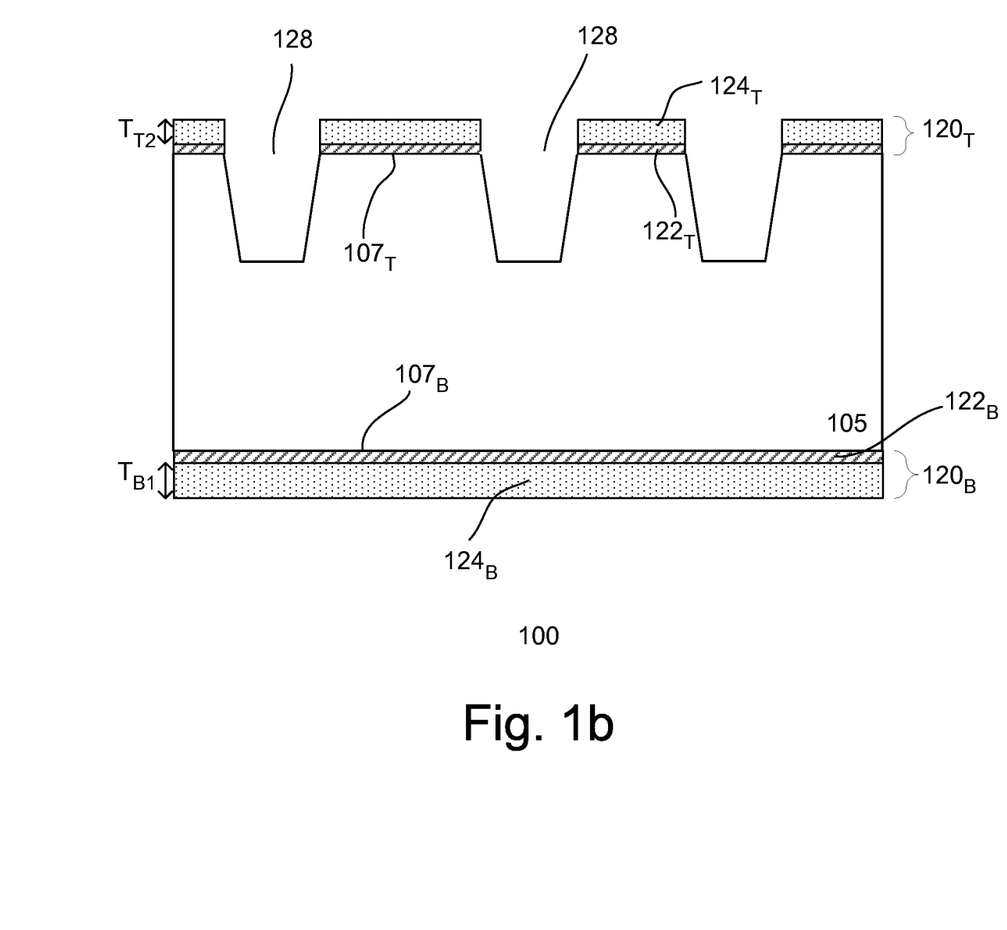

Referring to FIG. 1b, the process continues to form isolation regions. Isolation regions may be provided for isolating or separating different device regions of the substrate. To form isolation regions, a soft mask (not shown) is formed over the frontside pad nitride. The soft mask, such as a photoresist, is patterned to create openings corresponding to locations where isolation trenches are to be formed. Patterning the resist layer includes exposing portions of the resist to an exposure source through a mask and developing it to remove exposed or unexposed portions, depending on whether a positive or negative resist is used. The openings in the soft mask layer expose portions of the frontside pad nitride $124_T$.

In FIG. 1b, the frontside pad stack $120_T$ is patterned, removing portions exposed by the soft mask openings. As such, the pattern of the soft mask is transferred to the frontside pad stack. The patterning of the frontside pad stack forms openings, exposing the substrate surface $107_T$. Patterning of the frontside pad stack is achieved by, for example, an anisotropic etch, such as reactive ion etching (RIE).

The process continues to form isolation trenches 128 in the substrate. In one embodiment, the isolation trenches are used to form shallow trench isolation (STI) regions. Forming other types of trench isolation regions may also be useful. Providing the trenches for other purposes may also be useful. As shown in FIG. 1b, an etch process is performed using the frontside pad nitride $124_T$ as a hard mask to etch the exposed substrate through the pad stack openings, forming isolation trenches 128. The etch process, for example, includes RIE and the isolation trenches includes high aspect ratio trenches. The trenches, for example, may extend to a depth of about 2000-5000 Å. Forming isolation trenches which extend to other depths may also be useful. The isolation trenches, as shown in FIG. 1b, include tapered sidewall profile. It is understood that the isolation trenches may also include straight sidewall profile or other suitable shape profiles.

During the etch process to form the isolation trenches, the thickness of the frontside pad nitride $124_T$ is reduced to a second thickness $T_{T2}$ while the thickness of the backside pad nitride $124_B$ remains as $T_{B1}$. The frontside pad nitride $124_T$ is partially consumed during the etch process. The thickness $T_{T2}$, for example, may be about 900 Å. Other suitable thickness dimensions may also be useful.

Figure 1C:
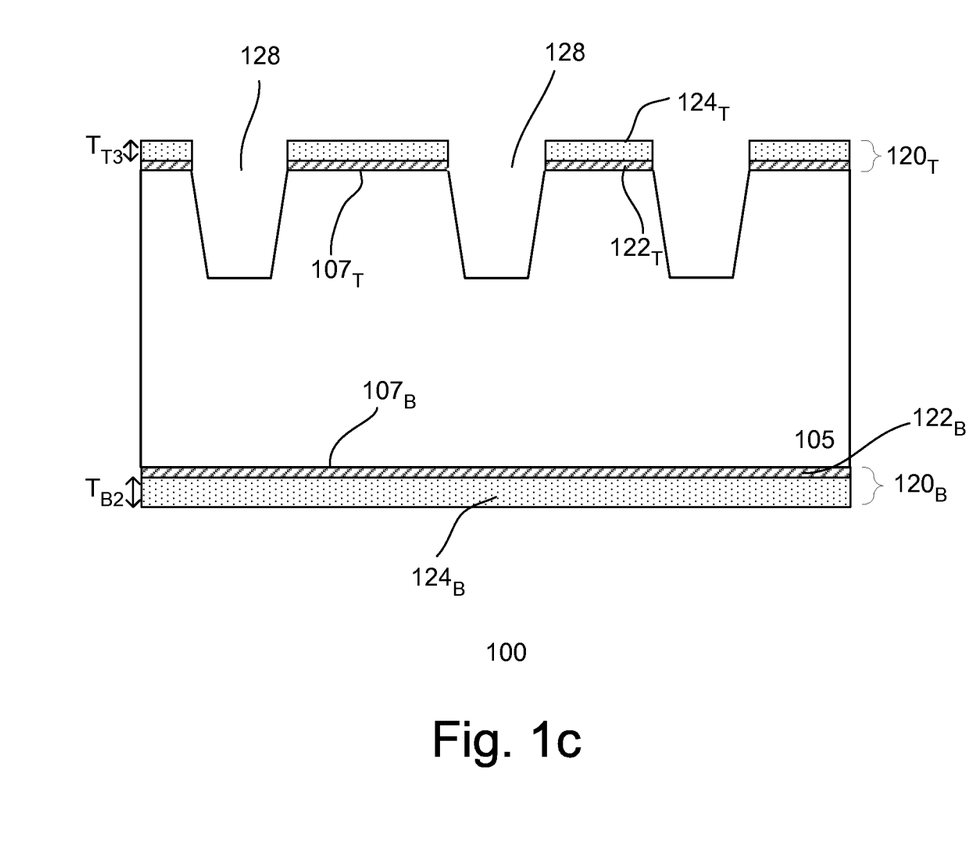

Referring to FIG. 1c, the process continues by performing a pull-back process on the frontside and backside pad nitride layers $124_T$ and $124_B$. The pull-back process, in one embodiment, is performed by a batch wet etch process or wet bench process. The batch wet etch process, for example, employs an etch solution which etches the pad nitride layer with high selectivity to the pad oxide layers. For example, the batch wet etch process includes the use of hot phosphoric acid or hydrofluoric acid/ethylene glycol (HF/EG) mixture to simultaneously remove portions of both the frontside and backside pad nitride layers. Other suitable etch solution or etch techniques may also be used. The pull-back process, in one embodiment, reduces the thickness of the frontside pad nitride layer to a thickness $T_{T3}$ while the thickness of the backside pad nitride layer is reduced to a thickness $T_{B2}$. In one embodiment, $T_{B2}$ includes thickness which is different than $T_{T3}$. The thickness $T_{B2}$, in one embodiment, is larger than $T_{T3}$. For example, $T_{B2}$ may be about 1150-1200 Å while $T_{T3}$ may be about 750-800 Å. Other suitable thickness ranges may also be useful. The pull-back process improves the STI gap fill as will be described later.

Figure 1D:
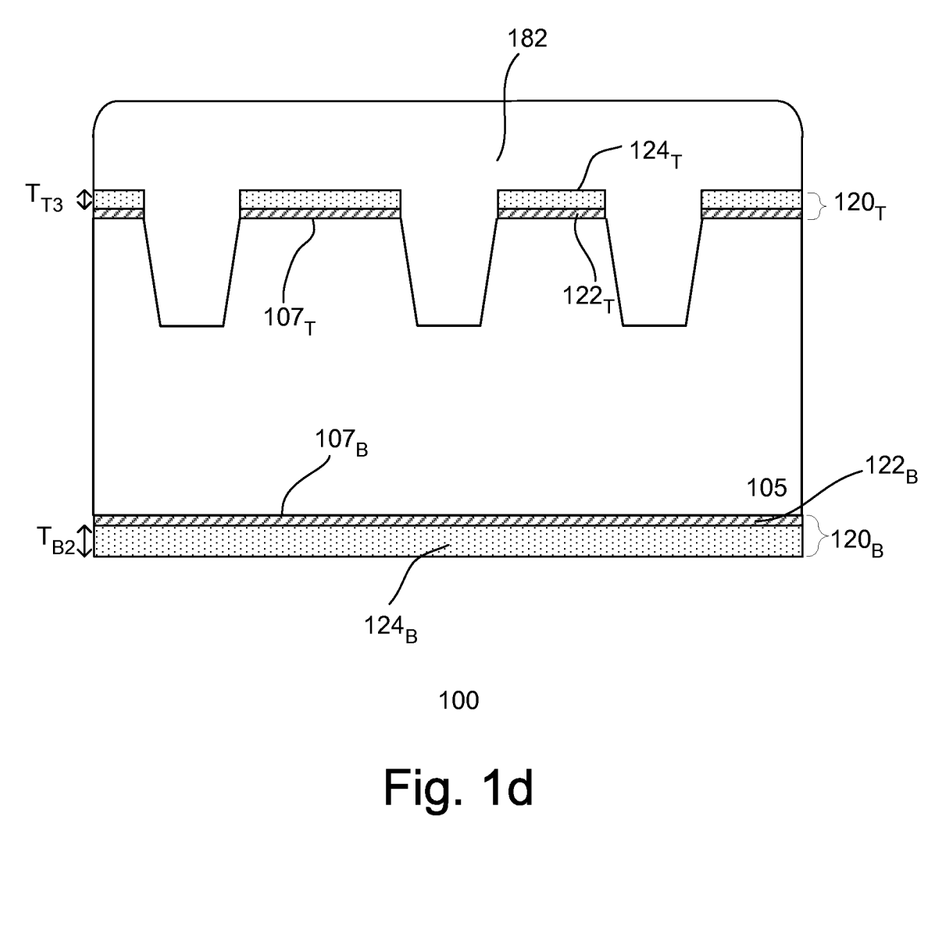

Referring to FIG. 1d, the process continues to complete the isolation structures by filling the trenches with a dielectric material 182. For example, a liner layer (not shown) can be formed on the substrate, lining the trench sidewalls to relieve stress and repair etching damage to the silicon substrate. The liner, for example, includes silicon oxide. The liner can be formed by, for example, silicon oxynitride (SiON) or a $Si_3N_4$/$SiO_2$ hybrid. A dielectric layer 182 is formed on the substrate, covering the frontside pad stack and filling the trenches. The dielectric layer 182 may be formed by chemical vapor deposition (CVD) process, such as high density plasma (HDP) CVD or subatmospheric CVD (SACVD). The dielectric layer may optionally also cover the side surfaces of the frontside and backside pad stack and side surfaces of the wafer substrate. Other suitable techniques may be used to form the dielectric layer. In one embodiment, the dielectric layer includes an oxide material, such as $SiO_2$. Other suitable types of insulating materials may also be used. The thickness of the dielectric layer, for example, may be about 5000-7000 Å. Other suitable thickness ranges may also be useful so long as it is sufficient to completely fill the trenches. An anneal may be performed to densify the dielectric layer.

Figure 1E:
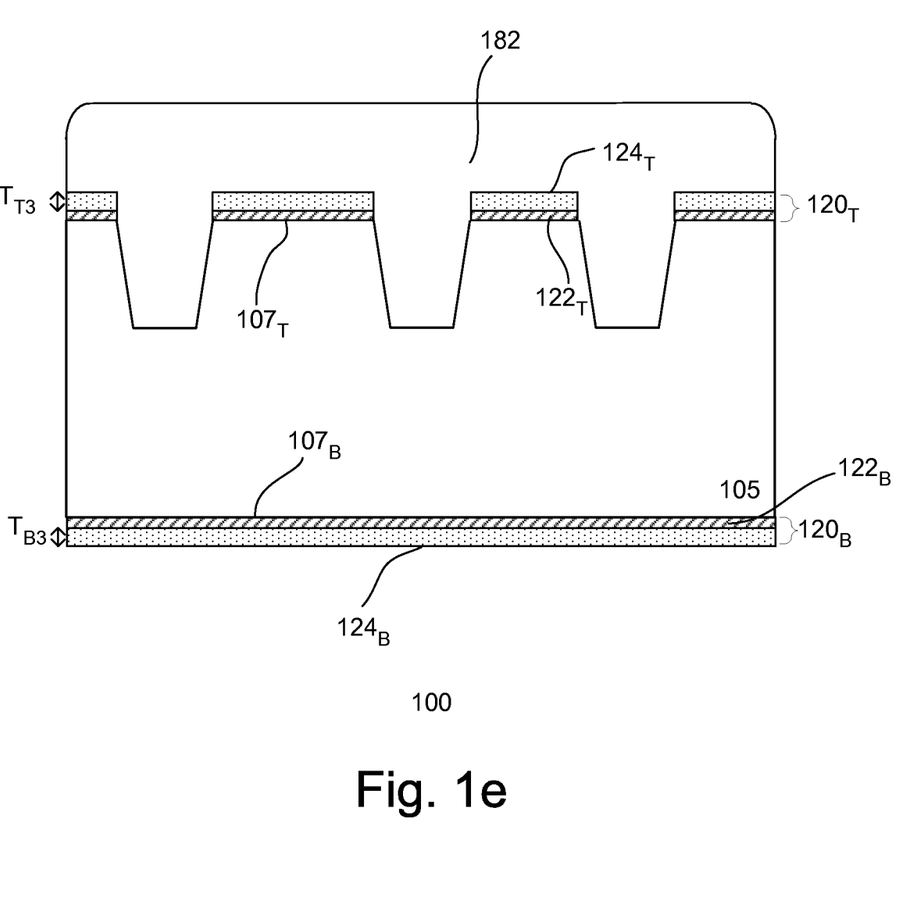

In FIG. 1e, the second pad layer $124_B$ of the backside pad stack is thinned. In one embodiment, a thinning process is performed on the backside pad nitride. The backside pad nitride $124_B$, for example is thinned by a wet etch process. In one embodiment, portion of the backside pad nitride is removed by a batch wet etch process. The batch wet etch process, for example, may employ the same etch solution as described with respect to FIG. 1c. For example, the batch wet etch process includes the use of hot phosphoric acid to remove portion of the backside pad nitride layer $124_B$. Other suitable techniques may also be employed for the thinning process. Since the etching of the nitride is highly selective to oxide, the dielectric layer 182 will not be damaged during the batch wet etch process. The dielectric layer 182 thus protects the pad nitride layer $124_T$ of the frontside pad stack. This preserves the integrity of the frontside pad stack while the backside pad nitride $124_B$ is thinned. Other suitable etch solution or etch techniques may also be used.

The batch wet etch process, in one embodiment, reduces the thickness of the backside pad nitride layer to a thickness $T_{B3}$. In one embodiment, $T_{B3}$ includes a thickness which is about the same as the thickness of the frontside pad nitride $T_{T3}$ which is protected by the dielectric layer 182. The thickness $T_{B3}$, for example, may be about 750-800 Å. Other suitable thickness dimensions for $T_{B3}$ may also be useful so long as it is about the same thickness as $T_{T3}$.

Figure 1F:
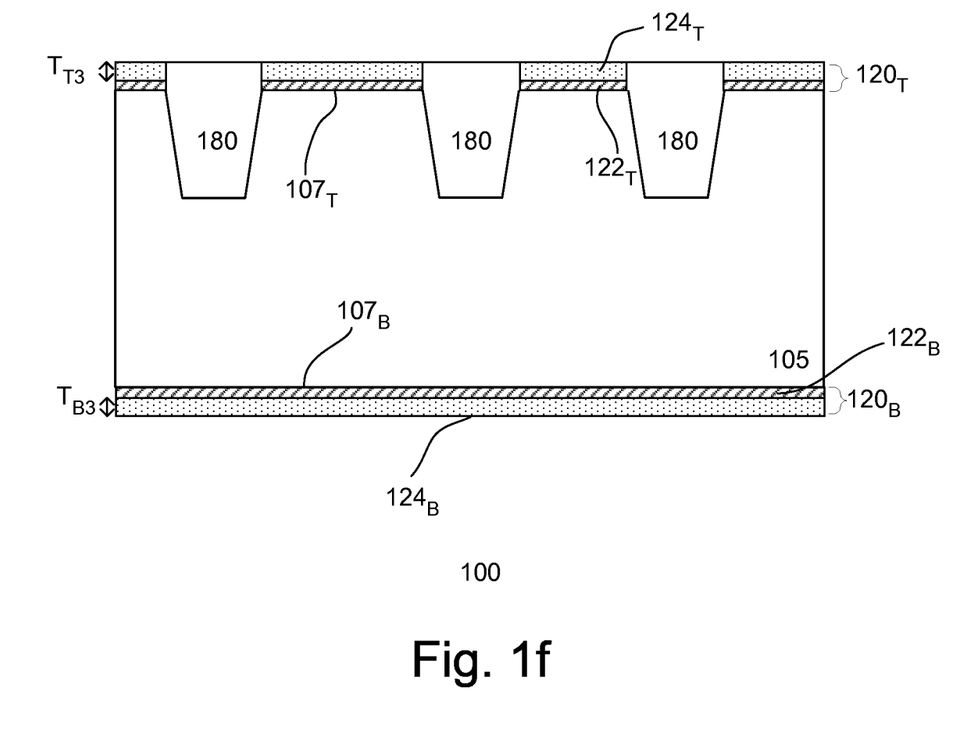

Referring to FIG. 1f, excess dielectric material over the substrate is removed by, for example, chemical mechanical polishing (CMP). The CMP produces STI structures having top surfaces which are substantially co-planar with the top surfaces of the frontside pad nitride $124_T$. The CMP may remove minimal portion of the frontside nitride. Other suitable techniques may also be used to planarize the dielectric material.

Figure 1G:
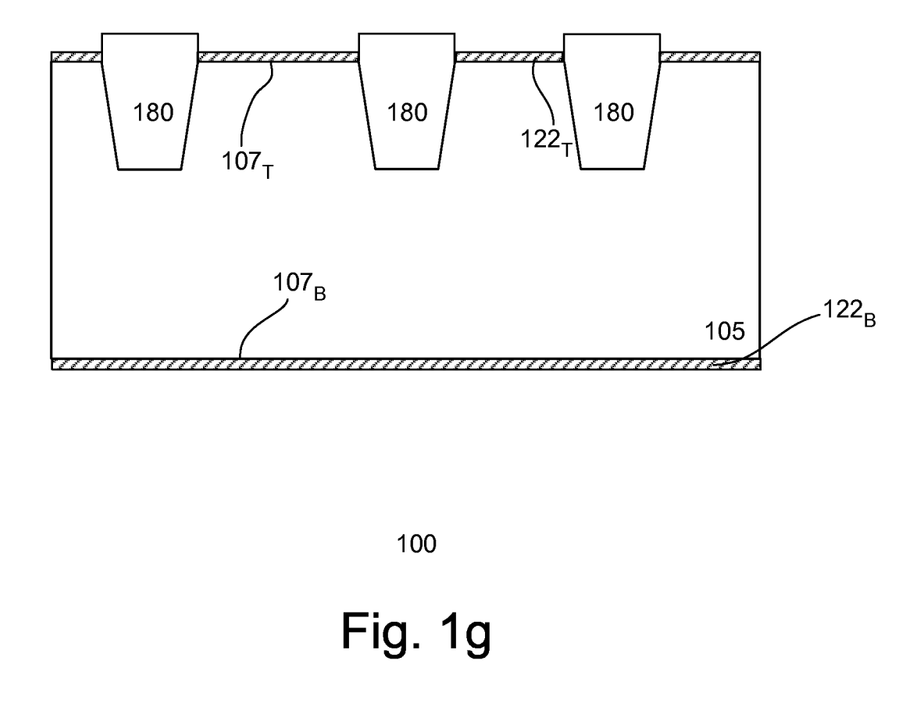
Figure 1H:
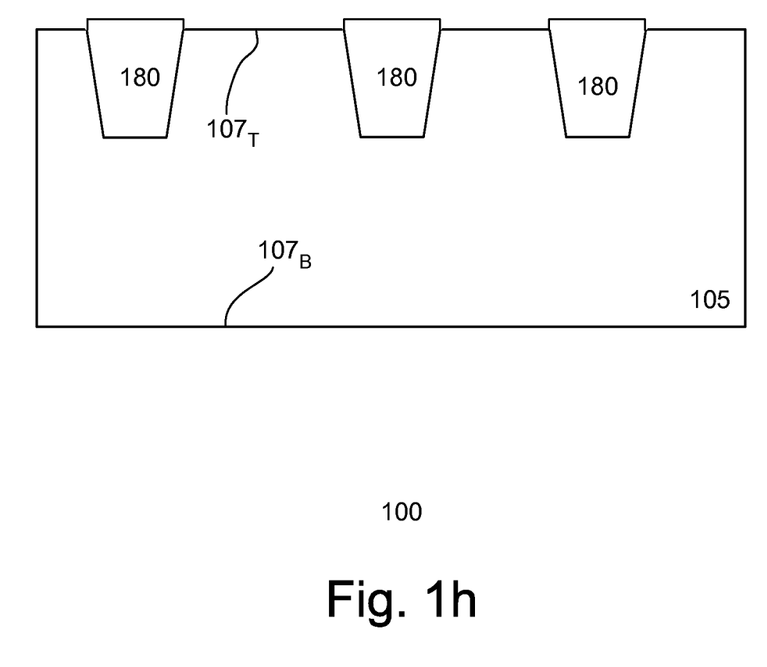

The process continues by removing the remaining portion of the frontside and backside pad nitride layers by a wet etch process as shown in FIG. 1g. The wet etch process, for example, includes a batch wet etch process. The batch wet etch process, for example, may employ the same etch solution as described in FIG. 1c. The wet etch process simultaneously remove the frontside and backside pad nitride layers $124_T$ and $124_B$ to expose the frontside and backside pad oxide layers $122_T$ and $122_B$. Other suitable techniques may also be used to remove the remaining portion of the frontside and backside pad nitride layers. In one embodiment, a stripping process may be performed to remove the remaining pad oxide layers over the frontside and backside of the wafer substrate as shown in FIG. 1h to expose the substrate frontside and backside surfaces and an oxide growth process (not shown) may be performed subsequently to form a sacrificial oxide layer (not shown) for well implant to form device wells. The pad oxide layers, for example, may be removed by a wet etch process, such as HF. The stripping process may also partially reduce the thickness of the protruded STI structures 180. In another embodiment, the remaining pad oxide layers may not be removed and therefore remain for well implant. Thus, the remaining pad oxide layers may serve as the sacrificial oxide layer.

Figure 1I:
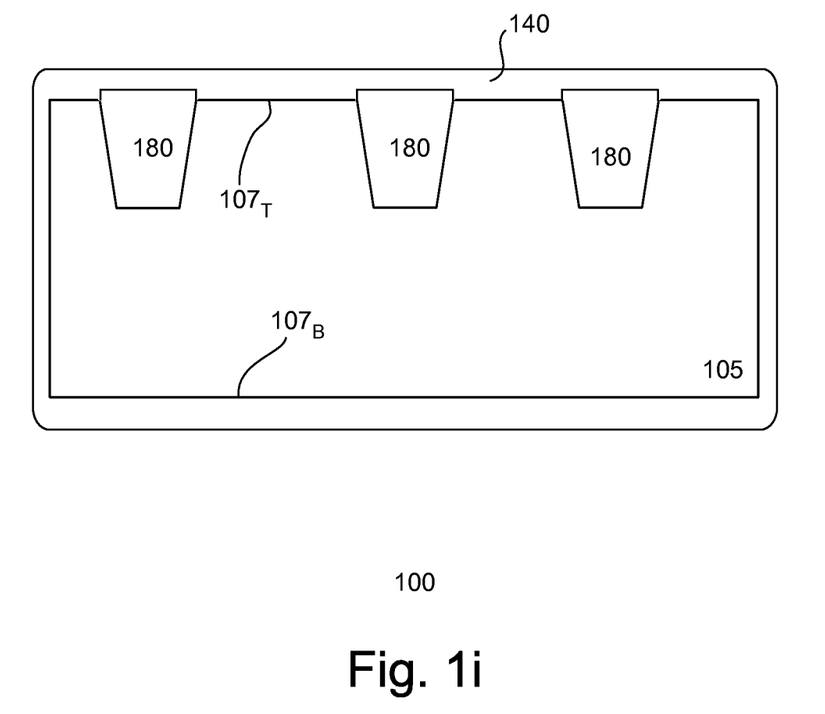

The process continues to form devices, such as transistors. Referring to FIG. 1i, the process continues to form a gate dielectric layer 140 over the substrate. For example, the gate dielectric layer includes an oxide. The oxide layer is formed by, for example, using a high temperature wet oxidation.

Other suitable techniques may also be employed to form the gate dielectric layer. As shown in FIG. 1i, the gate dielectric layer surrounds the top, bottom and side surfaces of the substrate. For illustration purpose, the gate dielectric layer 140 includes a thickness which is suitable for forming gate dielectric of a HV transistor. For example, the thickness of the gate dielectric layer may be about 700 Å. It is understood that the gate dielectric layer 140 may have other suitable thickness dimensions which are suitable for use in other types of devices, such as but not limited to LV or MV transistors.

Figure 1J:
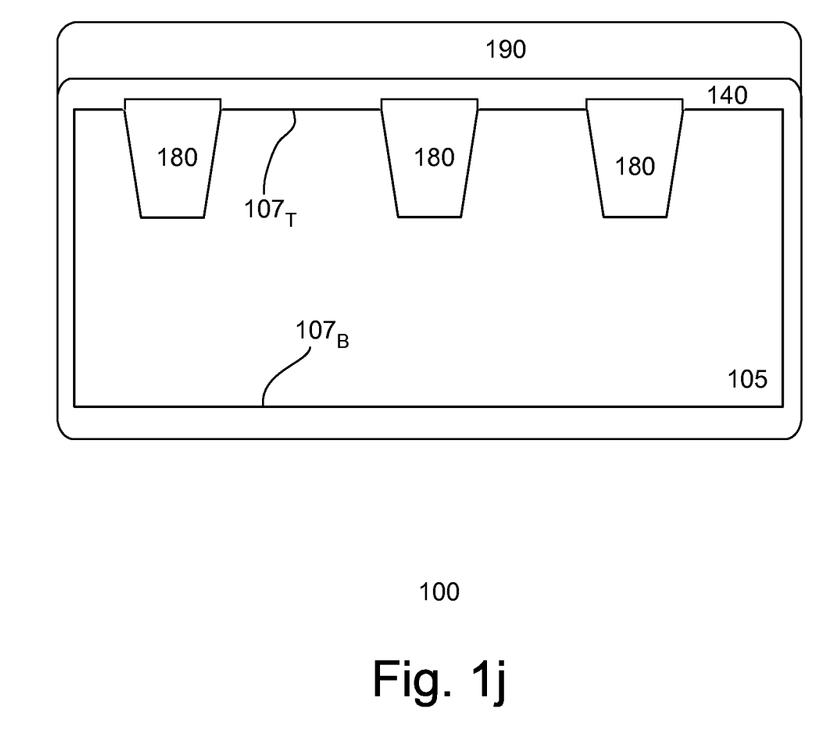

In FIG. 1j, a protective layer 190 is disposed on a top surface of the gate dielectric layer. In one embodiment, the protective layer includes a photoresist layer. The thickness of the photoresist layer, for example, is about 5000 Å. Other thickness ranges may also be useful depending on the material used and as long as it is sufficiently thick to prevent penetration of chemical during removal of portions of the gate dielectric layer later. Other suitable types of dielectric layer which is easily removed may also be used as the protective layer.

An etch process is performed to remove portions of the gate dielectric layer unprotected by the protective layer 190. The etch process, for example, includes a wet etch process. The wet etch, in one embodiment, includes dilute hydrofluoric acid (DHF) or buffered hydrofluoric acid (BHF). Other suitable types of etch solution may also be useful. The etch process removes the exposed portions of the gate dielectric layer which are disposed at the sides and backside of the wafer substrate.

Figure 1K:
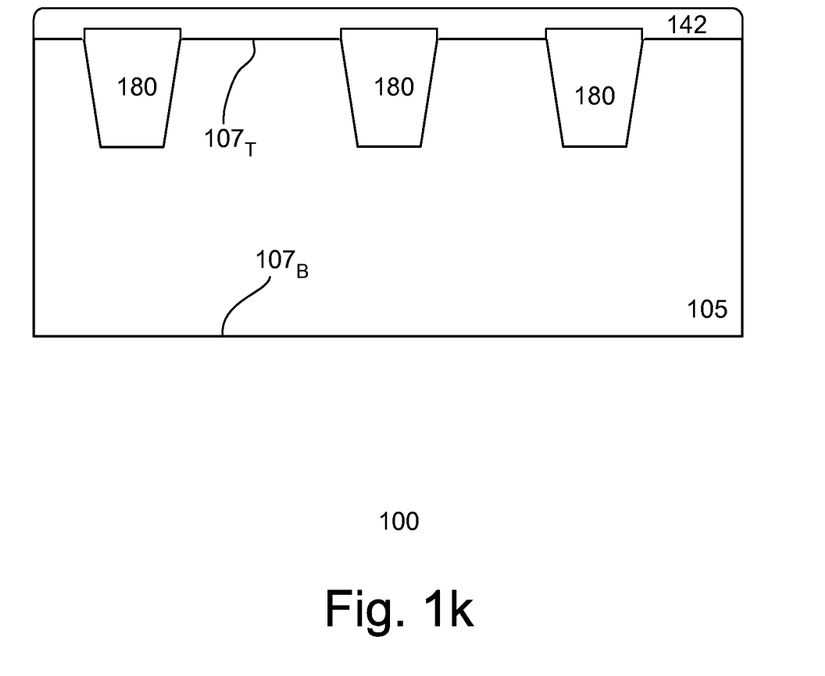

Referring to FIG. 1k, the protective layer 190 is removed. The protective layer, for example, is removed by an etch process. The etch process, for example, includes a wet etch process. The wet etch, in one embodiment, includes sulfuric peroxide mixture (SPM). Other suitable types of etch solution may also be used to remove the protective layer, depending on the material of the protective layer. The removal of the protective layer exposes the remaining gate dielectric layer 142 disposed over the frontside of the wafer substrate.

A soft mask (not shown) is formed on the substrate and patterned. The soft mask is patterned to expose portions of the gate dielectric layer 142. The soft mask, for example, serves as a HV gate mask. The exposed portions of the gate dielectric layer 142 are removed to form at least the gate dielectric 144 of the HV transistors in the HV device regions as shown in FIG. 1l. Removal can be achieved using, for example, an anisotropic etch such as RIE. The etch is preferably selective to the substrate. Other techniques may also be useful. The soft mask is removed after etching.

Figure 1M:
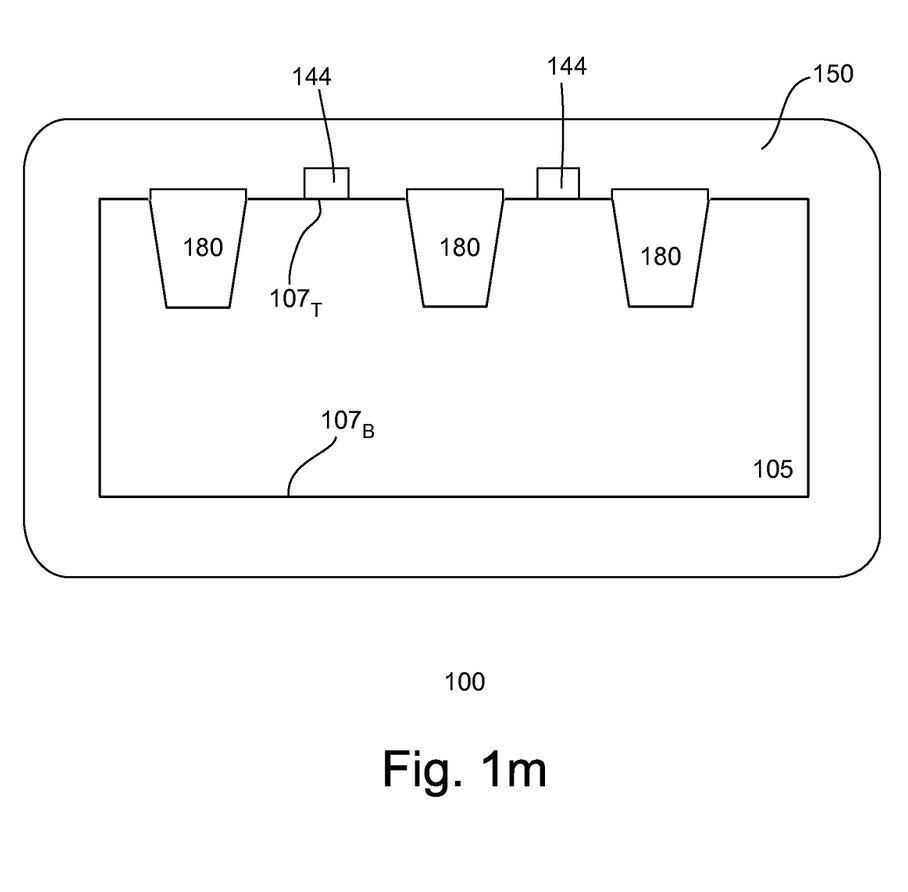

After forming the gate dielectric 144, the process continues to form a gate electrode layer 150 over the substrate as shown in FIG. 1m. For example, the gate electrode layer 150 includes a polysilicon layer. Other suitable materials and various suitable techniques may be employed to form the gate electrode layer. Referring to FIG. 1m, the gate electrode layer surrounds and directly contacts the top, bottom and side surfaces of the wafer substrate as well as covering the gate dielectric 144. The gate electrode layer 150 is patterned by mask and etch techniques to form the gate of the transistors (not shown).

The process continues to complete the formation of transistors. Forming other types of components (not shown) at other device regions (not shown) may also be useful. The process continues until processing of the wafer is completed. For example, interconnect levels, passivation, dicing the wafer into individual chips, testing and packaging may be performed.

The process, as described with respect to FIGS. 1a-1m, results in advantages. As described, the dielectric layer which fills the STI trenches also serves as a protective layer for the frontside pad nitride which allows for batch processing to thin or reduce the thickness of the backside pad nitride layer to be about the same as the thickness of frontside pad nitride layer. Since the thicknesses of the frontside and backside pad nitride layer are about the same, this enables a batch wet etch process to be performed to simultaneously remove the frontside and backside pad nitride layers completely from the substrate. The batch wet etch process is a relatively fast removal method and it uses existing tool set and does not require additional special backside cleaning tool. As such, the process provides for a low cost, time savings and high throughput solution. Furthermore, flipping of the wafer to remove the backside pad nitride may be difficult for large size wafers, such as the 300 mm or 450 mm wafers. The process as described does not have such concern or avoids such problem since flipping of the wafer is not required. Furthermore, since the frontside and backside pad nitride layers are completely removed from the substrate, the issue with unbalanced stress level between the frontside and backside of the wafer does not exist and therefore minimizes or prevents wafer warpage. In addition, by removing the gate dielectric layer from the backside of the wafer substrate, wafer warpage is further minimized or prevented. In addition, we have also found that if the gate dielectric layer remains on the sides of the wafer and the gate electrode layer is formed thereover, subsequent wet etch process may lead to gate dielectric undercut at the sides of the wafer substrate which may cause peeling of the gate electrode at these locations. As such, having portions of the gate dielectric layer which are disposed at the sides and backside of the wafer substrate being removed prior to forming the gate electrode layer avoids such issue since the gate electrode layer is directly formed over and contacts the wafer substrate.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate having top and bottom pad stacks, wherein each pad stack comprises at least first and second pad layers, and the second pad layers of the top and bottom pad stacks comprise an initial thickness $T_{T1}$ and $T_{B1}$ respectively;
   forming shallow trench isolation (STI) regions in the substrate, wherein forming the STI regions comprises
      patterning the top pad stack to form openings corresponding to the STI regions,
      etching the substrate to form isolation trenches of the STI regions through the top pad stack openings, wherein etching the substrate removes exposed portions of the substrate and also reduces the thickness $T_{T1}$ to a second thickness $T_{T2}$, and
      after etching the substrate, performing a pull-back process to simultaneously reduce the thickness $T_{T2}$ of the second pad layer of the top pad stack to a third thickness $T_{T3}$ and the thickness of $T_{B1}$ of the second pad layer of the bottom pad stack to a second thickness $T_{B2}$, wherein the pull-back process is a batch wet etch process and $T_{T3}$ is different than $T_{B2}$; and
   performing a removal process to completely and simultaneously remove the second pad layers of the top and bottom pad stacks having reduced thickness from the substrate after forming the STI regions.

2. The method of claim 1 wherein the first pad layer comprises silicon oxide and the second pad layer comprises silicon nitride.

3. The method of claim 1 wherein the second pad layer is over the first pad layer.

4. The method of claim 1 wherein $T_{T1}$ is about the same as $T_{B1}$.

5. The method of claim 1 wherein:
the thickness $T_{T2}$ is reduced uniformly throughout the second pad layer of the top pad stack to the third thickness $T_{T3}$ and the thickness $T_{B1}$ is reduced uniformly throughout the second pad layer of the bottom pad stack to the second thickness $T_{B2}$ by the pull-back process; and
the thickness $T_{T3}$ is thinner than the thickness $T_{B2}$.

6. The method of claim 1 comprising:
forming a dielectric layer on the substrate covering the top pad stack and filling the trenches after performing the pull-back process;
reducing the thickness $T_{B2}$ of the second pad layer of the bottom pad stack to a final thickness $T_{B3}$ by a batch wet etch process after forming the dielectric layer, wherein the dielectric layer protects the top pad stack during reducing the thickness $T_{B2}$ of the second pad layer to the final thickness $T_{B3}$, wherein $T_{B3}$ is about the same as $T_{T3}$; and
removing excess dielectric layer over the substrate to expose a top surface of the top pad stack.

7. The method of claim 6 wherein the second pad layers of the top and bottom pad stack having the thicknesses $T_{T3}$ and $T_{B3}$ are removed completely and simultaneously by a batch wet etch process after removing the excess dielectric layer.

8. The method of claim 6 wherein the dielectric layer comprises the same material as the first pad layer.

9. The method of claim 8 wherein the dielectric layer and the first pad layer comprises silicon oxide.

10. The method of claim 1 wherein the removal process comprises a batch wet etch process which removes the second pad layers using an etch solution which is highly selective to the first pad layer.

11. The method of claim 10 comprising forming a gate dielectric layer on the substrate, wherein the gate dielectric layer surrounds top, bottom and side surfaces of the substrate.

12. The method of claim 11 comprising:
forming a protective layer over a top surface of the gate dielectric layer, wherein the protective layer covers and protects portion of the gate dielectric layer which is disposed on and contact the top surface of the substrate; and
removing exposed portions of the gate dielectric layer which are disposed on and contact the bottom and side surfaces of the substrate and are not covered by the protective layer.

13. The method of claim 12 comprising:
removing the protective layer after removing exposed portions of the gate dielectric layer; and
patterning the remaining gate dielectric layer over the substrate using a patterned soft mask to form gate dielectric of transistors.

14. The method of claim 13 comprising forming a gate electrode layer on the substrate after patterning the remaining gate dielectric layer, wherein the gate electrode layer surrounds and directly contacts top, bottom and side surfaces of the substrate as well as covering the gate dielectric.

15. A method of forming a device comprising:
providing a substrate having top and bottom pad stacks, wherein each pad stack comprises at least first and second pad layers, and the second pad layers of the top and bottom pad stacks comprise an initial thickness $T_{T1}$ and $T_{B1}$ respectively;
forming shallow trench isolation (STI) regions in the substrate, wherein forming the STI regions comprises
patterning the top pad stack to form openings corresponding to the STI regions,
etching the substrate to form isolation trenches of the STI regions through the top pad stack openings, wherein etching the substrate removes exposed portions of the substrate and also reduces the thickness $T_{T1}$ to a second thickness $T_{T2}$, and
after etching the substrate, performing a pull-back process to simultaneously reduce the thickness $T_{T2}$ of the second pad layer of the top pad stack to a third thickness $T_{T3}$ and the thickness of $T_{B1}$ of the second pad layer of the bottom pad stack to a second thickness $T_{B2}$, wherein the pull-back process is a batch wet etch process and $T_{T3}$ is different than $T_{B2}$;
performing a removal process to completely and simultaneously remove the second pad layers of the top and bottom pad stacks having reduced thickness from the substrate after forming the STI regions;
forming a gate dielectric layer surrounding top, bottom and side surfaces of the substrate;
forming a protective layer over a top surface of the gate dielectric layer, wherein the protective layer only covers and protects portion of the gate dielectric layer which is disposed on and contacts the top surface of the substrate; and
removing exposed portions of the gate dielectric layer not covered by the protective layer.

16. The method of claim 15 wherein the second pad layers of the top and bottom pad stacks having reduced thickness are completely and simultaneously removed by a batch wet etch process.

17. The method of claim 16 wherein the batch wet process removes the second pad layers using an etch solution which is highly selective to the first pad layer.

18. The method of claim 15 wherein the first pad layer comprises silicon oxide and the second pad layer comprises silicon nitride.

19. The method of claim 15 wherein the protective layer comprises a photoresist layer.

20. The method of claim 15 wherein forming the STI regions further comprises:
forming a dielectric layer on the substrate covering the top pad stack and filling the trenches; and
reducing the thickness $T_{B2}$ of the second pad layer of the bottom pad stack to a final thickness $T_{B3}$ by a batch wet etch process after forming the dielectric layer, wherein the dielectric layer protects the top pad stack during reducing the thickness $T_{B2}$ of the second pad layer of the bottom pad stack to the final thickness $T_{B3}$.

* * * * *